United States Patent
Shimizu et al.

(10) Patent No.: US 10,361,517 B2
(45) Date of Patent: Jul. 23, 2019

(54) ELECTROMAGNETIC SHIELDING COMPONENT AND CONDUCTIVE PATH

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventors: Takeshi Shimizu, Yokkaichi (JP); Hirotaka Baba, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/323,723

(22) PCT Filed: Aug. 16, 2017

(86) PCT No.: PCT/JP2017/029432
§ 371 (c)(1),
(2) Date: Feb. 6, 2019

(87) PCT Pub. No.: WO2018/037977
PCT Pub. Date: Mar. 1, 2018

(65) Prior Publication Data
US 2019/0181592 A1 Jun. 13, 2019

(30) Foreign Application Priority Data
Aug. 25, 2016 (JP) .................................. 2016-164766

(51) Int. Cl.
*H01R 13/6581* (2011.01)
*H02G 3/04* (2006.01)
(Continued)

(52) U.S. Cl.
CPC .......... *H01R 13/6581* (2013.01); *H01B 7/18* (2013.01); *H02G 3/0412* (2013.01); *H05K 9/0081* (2013.01); *H01R 2201/26* (2013.01)

(58) Field of Classification Search
CPC ............ H01R 13/6581; H01R 2201/26; H02G 3/0412; H01B 7/18; H05K 9/0081
(Continued)

(56) References Cited

U.S. PATENT DOCUMENTS

2013/0032393 A1* 2/2013 Toyama .............. B60R 16/0215
174/72 A
2013/0299234 A1* 11/2013 Izawa ..................... H02G 3/06
174/70 R
(Continued)

FOREIGN PATENT DOCUMENTS

| JP | 2007-280814 A | 10/2007 |
| JP | 2012-113949 A | 6/2012 |
| JP | 2012-226832 A | 11/2012 |

OTHER PUBLICATIONS

Nov. 21, 2017 Search Report issued in International Patent Application No. PCT/JP2017/029432.

*Primary Examiner* — Sherman Ng
(74) *Attorney, Agent, or Firm* — Oliff PLC

(57) ABSTRACT

An electromagnetic shielding component that includes a pipe body that is conductive; and a braid that is tubular and that is obtained by braiding conductive bar wires, the braid and the pipe body being coupled to each other by a coupler in a state in which an end of the braid is externally fitted onto an end of the pipe body.

7 Claims, 3 Drawing Sheets

(51) Int. Cl.
*H01B 7/18* (2006.01)
*H05K 9/00* (2006.01)

(58) Field of Classification Search
USPC .................................................... 174/72 A
See application file for complete search history.

(56) References Cited

U.S. PATENT DOCUMENTS

| | | | |
|---|---|---|---|
| 2014/0038459 A1 | 2/2014 | Kobayashi | |
| 2014/0246231 A1* | 9/2014 | Adachi | B60R 16/0207 174/72 A |
| 2015/0250079 A1* | 9/2015 | Sugino | H05K 9/0009 174/372 |
| 2016/0134090 A1* | 5/2016 | Kushima | H02G 3/0481 174/362 |

* cited by examiner

ELECTROMAGNETIC SHIELDING COMPONENT AND CONDUCTIVE PATH

This application is the U.S. National Phase of PCT/JP2017/029432 filed Aug. 16, 2017, which claims priority from JP 2016-164766 filed Aug. 25, 2016, the entire disclosure of which is incorporated herein by reference.

BACKGROUND

The present disclosure relates to an electromagnetic shielding component and a conductive path that are used in, for example, a vehicular wire harness.

One example of wire harnesses installed in vehicles is a wire harness that includes a conductive path as disclosed in JP 2007-280814A in which an electromagnetic shielding component covers the circumference of an electric wire to prevent electromagnetic noise. The electromagnetic shielding component is formed such that end portions of a metal pipe and a tubular braided member are coupled to each other by a coupling member, and is configured to electromagnetically shield an electric wire that is passed through the series of tubular bodies constituted by the metal pipe and the braided member. The metal pipe of the electromagnetic shielding component physically protects the electric wire, and also keeps the electric wire in a shape conforming to a predetermined wiring path. On the other hand, the braided member is a member that is obtained by braiding metal wires into a tubular shape and is flexible, and thus can be subject to bending deformation in a portion close to a terminal end of the electric wire, for example.

Meanwhile, in the electromagnetic shielding component of JP 2007-280814A, a metal crimp ring is employed as the coupling member for coupling the metal pipe and the braided member. The crimp ring is configured to fasten, from the outer circumferential side, the braided member externally fitted onto the end portion of the metal pipe, so that the braided member is interposed between the outer circumferential surface of the metal pipe and the inner circumferential surface of the crimp ring.

SUMMARY

Meanwhile, in an electromagnetic shielding component as described above, thermal expansion and shrinkage caused by temperature change in the usage environment may increase the distance between the inner circumferential surface of the crimp ring and the outer circumferential surface of the metal pipe, and the fastening of the crimp ring around the braided member may become loose. Such a phenomenon is particularly noticeable when the metal pipe and the crimp ring have different linear expansion coefficients. If the fastening around the braided member becomes loose, part of the braided member that is in contact with the outer circumferential surface of the metal pipe may separate from the outer circumferential surface of the metal pipe. In this case, an oxide layer may form on the surface of the part of the braided member that is separated from the outer circumferential surface of the metal pipe, increasing in the contact resistance between the metal pipe and the braided member, and as a result, deteriorating the shielding property of the electromagnetic shielding component.

An exemplary aspect of the disclosure provides an electromagnetic shielding component and a conductive path that can suppress deterioration of the shielding property that may be caused by temperature change.

An electromagnetic shielding component according to a first exemplary aspect includes a pipe body that is conductive; and a braid that is tubular and that is obtained by braiding conductive bar wires, the braid and the pipe body being coupled to each other by a coupler in a state in which an end of the braid is externally fitted onto an end of the pipe body, wherein the coupler includes a spring that is annular in a free state, the spring has a diameter that is reduced due to a radially inward elastic force of the spring, an inner diameter of the spring that has the reduced diameter being set to a value smaller than an outer diameter of the pipe body at a lowest conceivable temperature in a usage environment, and the spring is externally arranged on the braid while surrounding an outer circumference of the braid, and is configured to sandwich and hold the braid together with the pipe body only using the radially inward elastic force of the spring, the diameter of the spring being able to be reduced using the radially inward elastic force of the spring in accordance with shrinkage in an outer diameter of the pipe body that is caused due to a reduction in the temperature in the usage environment.

With this configuration, the spring of the coupling uses its elastic force to fasten, from the outer circumferential side, the braid externally fitted onto an end of the pipe body, so that the braid and the pipe body are coupled to each other. Also, since the diameter of this spring can be reduced while conforming to the outer diameter of the pipe body, the fastening of the spring around the braid is not likely to become loose even if the temperature in the usage environment changes. Accordingly, the contact resistance between the pipe body and the braid is suppressed from increasing, and as a result, it is possible to suppress deterioration of the shielding property.

In the electromagnetic shielding component, the spring has a shape such that a flat spring is formed into an annular shape, and is provided with, at respective ends thereof, protrusions that protrude to the outer circumferential side.

With this configuration, since the diameter of the spring can easily be increased via the protrusions, it is possible to improve the assembling operability when coupling the pipe body and the braid.

In the electromagnetic shielding component, the braid and the coupler are made of different types of metal, and an insulator that is tubular is interposed between the braid and the spring of the coupler, the insulator covering the outer circumference of the braid.

With this configuration, since the insulator is interposed between the braid and the spring of the coupler, it is possible to suppress electric corrosion that may be caused by rainwater or the like entering a space between the braid and the spring of the coupler.

In the electromagnetic shielding component, the insulator is heat resistant.

With this configuration, even when the temperature in the usage environment is high, the insulation between the braid and the spring of the coupler can easily be ensured, and as a result, it is possible to suppress electric corrosion between the braid and the spring of the coupler more appropriately.

To solve the above-described problems, a conductive path includes: the above-described electromagnetic shielding component; and an electric wire that is passed through the pipe body and the braid of the electromagnetic shielding component.

With this configuration, it is possible to provide a conductive path with the shielding property thereof suppressed from deterioration caused by temperature change.

With the electromagnetic shielding component and the conductive path according to some aspects of the present disclosure, it is possible to suppress deterioration of the shielding property that may be caused by temperature change. Other configurations and advantages of the present disclosure should become apparent from the description below made with reference to the drawings illustrating examples of the technical idea of the present disclosure.

DETAILED DESCRIPTION OF EMBODIMENTS

Figure 1:
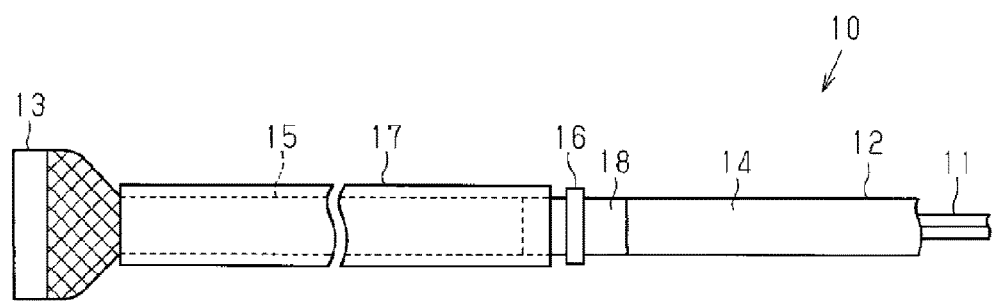
FIG. 1 is a schematic diagram illustrating part of a conductive path according to an embodiment.

Hereinafter, one embodiment of an electromagnetic shielding component and a conductive path will be described. Note that, in the drawings, part of configurations may be exaggerated or simplified for convenience of description. Furthermore, the dimensional ratio of constituent components may differ from the actual dimensional ratio.

A conductive path 10, shown in FIG. 1, of the present embodiment is used in a vehicular wire harness, and more specifically, the conductive path 10 is arranged extending, for example, under the floor of a vehicle such as a hybrid car, so as to connect a high-voltage battery installed in a rear portion of the vehicle and an inverter device installed in a front portion of the vehicle.

The conductive path 10 is provided with electric wires 11, an electromagnetic shielding component 12 that covers the electric wires 11, and a connector part 13 connected to end portions of the electric wires 11. The connector part 13 is designed to be connected to the above-described high-voltage battery or inverter device.

Figure 3:
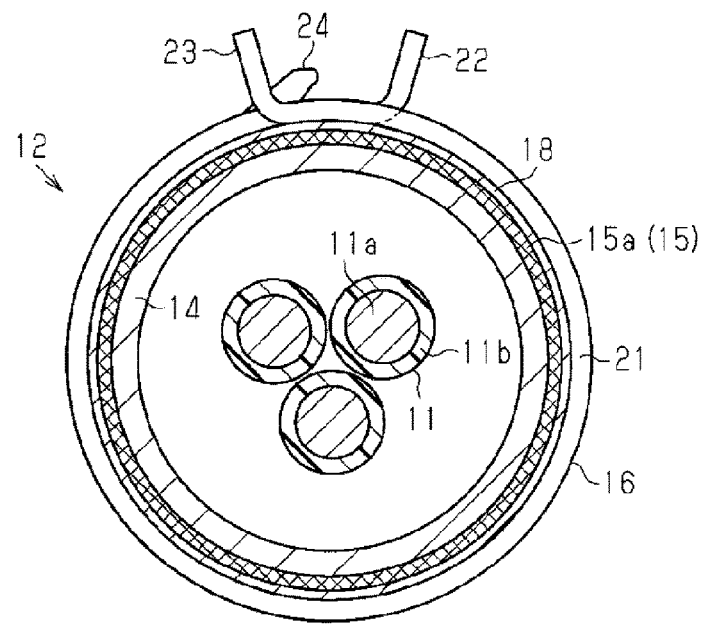
FIG. 3 is a cross-sectional view taken along a direction orthogonal to the axis of the coupled portion between the pipe body and the braided member according to the embodiment.

As shown in FIG. 3, each electric wire 11 includes a conductor 11a made of a single aluminum alloy core wire or twisted copper wires, and an insulating covering 1ib that is made of a synthetic resin and covers the outer circumference of the conductor 11a. The plurality of electric wires 11 are passed through the electromagnetic shielding component 12.

As shown in FIG. 1, the electromagnetic shielding component 12 includes a pipe body 14 that is made of a cylindrical metal pipe, a tubular braided member 15 (i.e., braid) that is obtained by braiding metal bar wires into a mesh, and a coupling member 16 (i.e., coupler) that couples the pipe body 14 and the braided member 15. The pipe body 14 and the braided member 15 are coupled to each other at their end portions by the coupling member 16, thus constituting a series of tubular bodies. Note that the pipe body 14 and the braided member 15 are made of the same type of metal material, namely, an aluminum metal material in the present embodiment. Furthermore, one end portion of the braided member 15 is coupled to the pipe body 14 and the other end portion is coupled to the connector part 13. Furthermore, in the present embodiment, the outer circumference of the braided member 15 is covered with an exterior member 17 (see FIG. 1) such as a bellows-like tubular corrugated tube. Note that, in FIG. 2, the exterior member 17 is not shown for convenience of description.

The pipe body 14 is arranged extending under the floor of the vehicle, and is bent into a predetermined shape that conforms to the underfloor configuration. Furthermore, the pipe body 14 has a shielding function, as well as a function of physically protecting the electric wires 11 passed therethrough because the pipe body 14 is a hard metal pipe.

Figure 2:
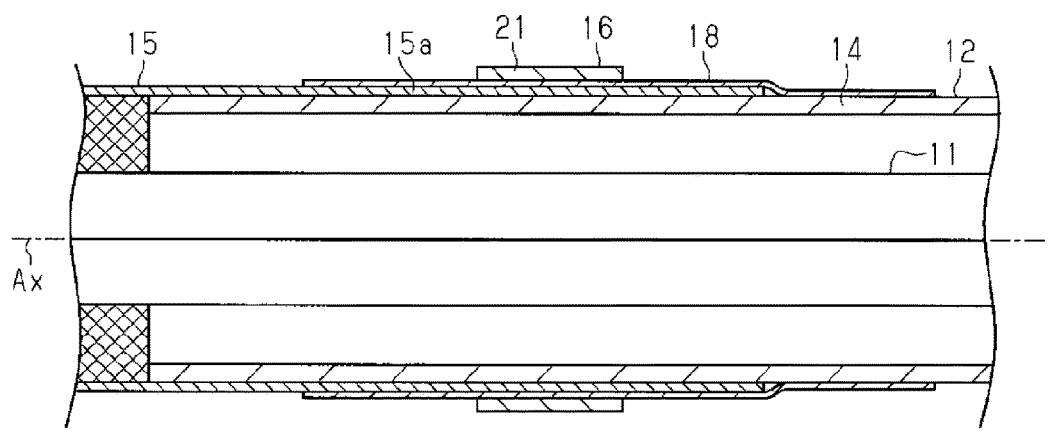
FIG. 2 is a cross-sectional view taken along an axial direction of a coupled portion of a pipe body and a braided member according to the embodiment.

As shown in FIGS. 2 and 3, the braided member 15, which is a tubular member obtained by braiding metal bar wires, has a shielding function and is flexible. One end portion of the braided member 15 is externally fitted onto one end portion of the pipe body 14, and this portion (externally fitted part 15a) of the braided member 15 that is externally fitted onto the pipe body 14 conforms to the circular shape of the outer circumferential surface of the pipe body 14, and is cylindrical. The externally fitted part 15a of the braided member 15 is in direct contact with the outer circumferential surface of the pipe body 14, so that the pipe body 14 and the braided member 15 are electrically conductive.

The coupling member 16 is fitted onto the outer circumference of the externally fitted part 15a of the braided member 15 via an insulating member 18 (i.e., insulator). The insulating member 18 is an adhesive tape made of a heat resistant synthetic resin for example, and is wound around the outer circumferential surface of the externally fitted part 15a. Note that the insulating member 18 is also wound continuously around the outer circumferential surface of the pipe body 14 that is not covered with the braided member 15. Furthermore, the coupling member 16 is fitted onto the outer circumference of the portion of the insulating member 18 that covers the externally fitted part 15a.

As shown in FIG. 3, the coupling member 16 has a spring part 21 (i.e., spring) that is obtained by curving one flat spring member made of stainless steel into an annular shape. The spring part 21 surrounds the outer circumference of the portion of the insulating member 18 that covers the externally fitted part 15a, and applies a radially inward elastic force. Accordingly, the spring part 21 is configured to fully circumferentially fasten, from the outer circumferential side, the externally fitted part 15a of the braided member 15, and sandwich the externally fitted part 15a together with the pipe body 14 in a radial direction. Note that, since the insulating member 18 interposed between the externally fitted part 15a and the spring part 21 is a flexible member, the radially inward elastic force of the spring part 21 is appropriately applied to the externally fitted part 15a.

A configuration is such that both end portions of the spring part 21 (flat spring member/flat spring) overlap each other when viewed in the axial direction, and both end portions of the spring part 21 respectively have protruding portions 22 and 23 (i.e., protrusions) that protrude to the outer circumferential side. The spring part 21 is designed such that, if a force for bringing the protruding portions 22 and 23 close to each other in a circumferential direction is applied to the protruding portions 22 and 23, the diameter of the spring part 21 increases resiliently, that is, temporarily.

Note that the protruding portions 22 and 23 are formed by bending the two end portions of the spring part 21 to the outer circumferential side.

Figure 4:
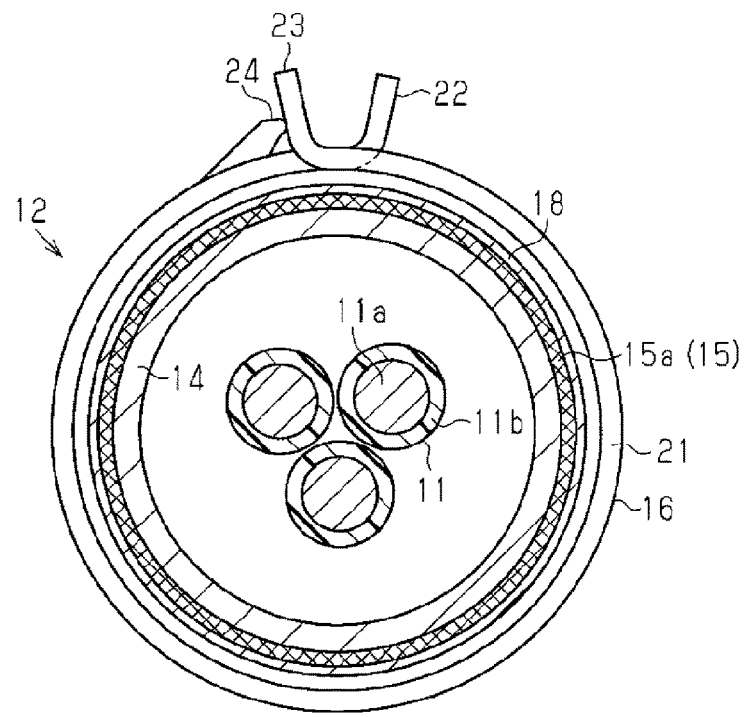
FIG. 4 is a cross-sectional view illustrating an assembled aspect of an electromagnetic shielding component according to the embodiment.

As shown in FIG. 4, at a position in the vicinity of the protruding portion 22 of the spring part 21, an engaging portion 24 (i.e., engagement) is formed that can engage the other protruding portion 23. As a result of the engaging portion 24 engaging the protruding portion 23, the spring part 21 can be kept in a state of having an increased diameter.

Figure 5:
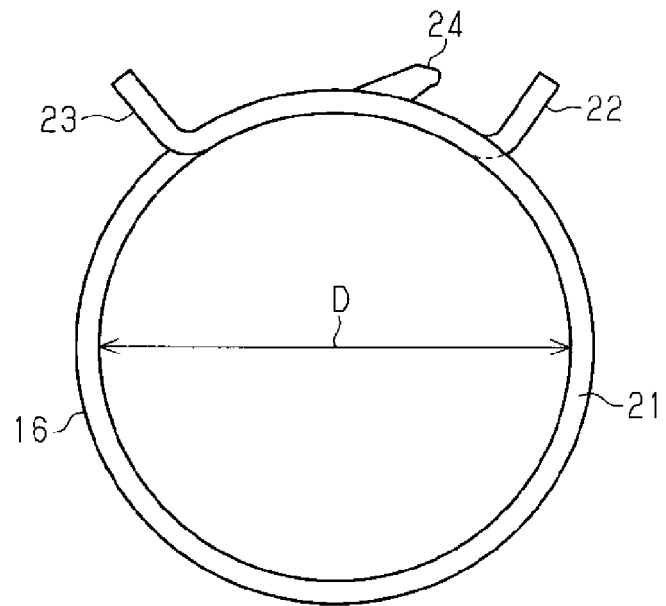
FIG. 5 is a front view illustrating a coupling member in a free state.

Also, FIG. 5 shows the coupling member 16 in a free state in which the engaging portion 24 is disengaged from the protruding portion 23. In its free state, the diameter of the spring part 21 of the coupling member 16 is reduced due to its radially inward elastic force, and an inner diameter D of the spring part 21 in this state is preferably set to a value that is smaller than the outer diameter of the pipe body 14 at the lowest conceivable temperature in the usage environment.

The following will describe an aspect of assembling the pipe body 14 and the braided member 15 using the coupling member 16.

First, an end portion of the braided member 15 is externally fitted onto an end portion of the pipe body 14, and then the insulating member 18 is wound around the outer circumferential surface of the externally fitted part 15a of the braided member 15. Note that, in the present embodiment, a plurality of electric wires 11 are passed through the pipe body 14 and the braided member 15 at this point in time, but the present disclosure is not limited to this.

Then, as shown in FIG. 4, the coupling member 16 is arranged on the outer circumferential side of the externally fitted part 15a of the braided member 15 around which the insulating member 18 is wound. At this time, the spring part 21 of the coupling member 16 is in the increased-diameter state in which the engaging portion 24 is engaged with the protruding portion 23, and there is a clearance between the spring part 21 and the insulating member 18.

Then, the engaging portion 24 is disengaged from the protruding portion 23 to release the radially inward elastic force of the spring part 21, and thereby the diameter of the spring part 21 is reduced. Accordingly, as shown in FIG. 3, the spring part 21 fastens the insulating member 18 and the externally fitted part 15a of the braided member 15 radially and inwardly, and thereby the externally fitted part 15a is fixed to the end portion of the pipe body 14. Furthermore, here, as a result of the braided member 15 being pressed against the outer circumferential surface of the pipe body 14, an oxide layer that was formed on the surfaces of the bar wires constituting the braided member 15 is removed. Accordingly, the electrical conduction between the braided member 15 and the pipe body 14 is sufficiently ensured, and as a result, the shielding property of the electromagnetic shielding component 12 is ensured.

The following will describe functions of the present embodiment.

If the temperature of the conductive path 10 in the usage environment decreases, the pipe body 14 will shrink in the radial direction. Since the pipe body 14 of the present embodiment is made of an aluminum metal material, which has a relatively large linear expansion coefficient, the degree of shrinkage in the radial direction is particularly large. Here, the diameter of the spring part 21 of the coupling member 16 is reduced in accordance with the shrinkage of the pipe body 14, and thus the externally fitted part 15a of the braided member 15 fastened radially and inwardly is not likely to become loose. Accordingly, such a phenomenon that, due to fastening around the braided member 15 becoming loose, an oxide layer reforms on the surface of the braided member 15 is not likely to occur. Accordingly, the contact resistance between the pipe body 14 and the braided member 15 is suppressed from increasing, and as a result, it is possible to suppress deterioration of the shielding property.

The following will describe characteristic effects of the present embodiment.

(1) The coupling member 16 includes the spring part 21 that is annular surrounding an outer circumference of the braided member 15 and is configured to sandwich the braided member 15 together with the pipe body 14 using a radially inward elastic force of the coupling member 16, a diameter of the spring part 21 being able to be reduced while conforming to the outer diameter of the pipe body 14. With this configuration, the spring part 21 of the coupling member 16 uses its elastic force to fasten, from the outer circumferential side, the braided member 15 externally fitted onto the end portion of the pipe body 14, so that the braided member 15 and the pipe body 14 are coupled to each other. Also, since the diameter of this spring part 21 can be reduced while conforming to the outer diameter of the pipe body 14, the fastening of the spring part 21 around the braided member 15 is not likely to become loose even if the temperature in the usage environment decreases. Accordingly, the contact resistance between the pipe body 14 and the braided member 15 is suppressed from increasing, and as a result, it is possible to suppress deterioration of the shielding property.

(2) The spring part 21 of the coupling member 16 has a shape such that a flat spring member is formed into an annular shape, and is provided with, at respective ends thereof, protruding portions 22 and 23 that protrude to the outer circumferential side. With this configuration, since the diameter of the spring part 21 can easily be increased via the protruding portions 22 and 23, it is possible to improve the assembling operability when coupling the pipe body 14 and the braided member 15.

(3) The braided member 15 and the coupling member 16 are made of different types of metal, and the insulating member 18 that is tubular is interposed between the braided member 15 and the spring part 21 of the coupling member 16, the insulating member 18 covering the outer circumference of the braided member 15. With this configuration, it is possible to suppress electric corrosion that may be caused by rainwater or the like entering a space between the braided member 15 and the spring part 21 of the coupling member 16. Furthermore, according to the present embodiment, since the pipe body 14 and the braided member 15 are made of the same type of metal, electric corrosion is not likely to occur between the pipe body 14 and the braided member 15. Accordingly, the coupling structure of the present embodiment between the pipe body 14 and the braided member 15 does not require a watertight member such as a grommet that covers the entire coupled portion of the pipe body 14 and the braided member 15, which can contribute simplification of the configuration.

(4) The insulating member 18 is heat resistant, and thus, even when the temperature in the usage environment is high, the insulation between the braided member 15 and the spring part 21 of the coupling member 16 can easily be ensured, and as a result, it is possible to suppress electric corrosion between the braided member 15 and the spring part 21 of the coupling member 16 more appropriately.

(5) The braided member 15 is made of an aluminum metal material on whose surface an oxide layer is likely to form, and thus it is possible to achieve, more efficiently, the effect of suppressing an increase in the contact resistance between the pipe body 14 and the braided member 15, the effect being achieved by the coupling member 16 including the spring part 21.

Note that the foregoing embodiment may be modified in the following manner.

Figure 6:
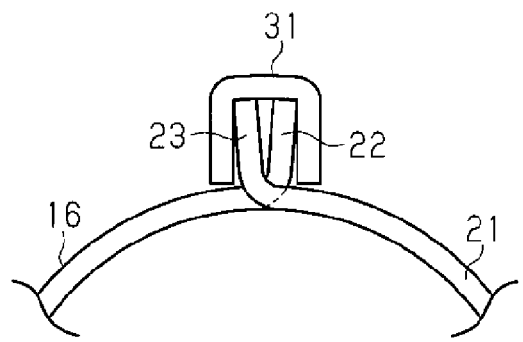
FIG. 6 is a front view illustrating part of a coupling member according to a modification.

Although the coupling member 16 of the foregoing embodiment is configured such that the engaging portion 24 is engaged with the protruding portion 23 and thereby the spring part 21 can be kept in the increased-diameter state, the present disclosure is not limited to this. For example, as shown in FIG. 6, a configuration is also possible in which an engaging member 31, which is separate from the coupling member 16, holds the protruding portions 22 and 23 in the circumferential direction and thereby the spring part 21 can be kept in the increased-diameter state. Note that a configuration that keeps the spring part 21 in the increased-diameter state, such as the engaging portion 24 or the engaging member 31, is not essential, and the engaging portion 24 may also be omitted from the coupling member 16 of the foregoing embodiment.

Figure 7:
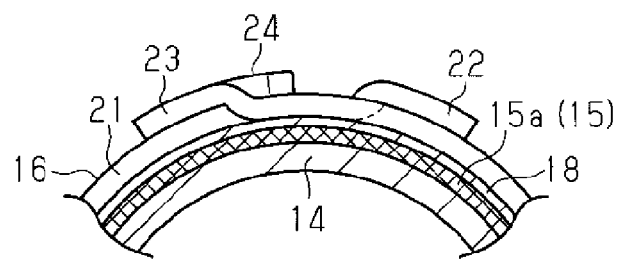
FIG. 7 is a cross-sectional view of part of an electromagnetic shielding component according to a modification.

In the foregoing embodiment, after the braided member 15 has been fastened and fixed using the elastic force of the spring part 21 of the coupling member 16, as shown in FIG. 7, the protruding portions 22 and 23 and the engaging portion 24 may also be folded down, for example. Accordingly, the protrusion heights, to the outer circumferential side, of the protruding portions 22 and 23 and the engaging portion 24 in the assembled state can be suppressed to be small. Accordingly, if, for example, exterior equipment is installed on the outer circumference of the coupling member 16, it will be possible to suppress, as much as possible, deterioration of the operability when assembling the exterior equipment. Note that, although, in the configuration shown in the same drawing, the protruding portions 22 and 23 are folded down in the circumferential directions opposing each other, the present disclosure is not limited to this, and the protruding portions 22 and 23 may also be folded down in the circumferential directions approaching each other. Furthermore, in the configuration shown in the same drawing, the protruding portions 22 and 23 and the engaging portion 24 are folded down, but instead, the protruding portions 22 and 23 and the engaging portion 24 may also be cut out, for example.

In the foregoing embodiment, the spring part 21 of the coupling member 16 is annular, but, since the shape of the spring part 21 is set conforming to the outer shape of the pipe body 14, it is desirable that the spring part 21 is ellipsoidal annular if the outer shape of the pipe body 14 is an ellipse.

In the foregoing embodiment, the connector part 13 and the braided member 15 may also be coupled to each other using a coupling member with a spring part, similar to the coupling member 16.

The materials of the pipe body 14, the braided member 15, and the coupling member 16 are not limited to those described in the foregoing embodiment. For example, the material of the pipe body 14 and the braided member 15 may also be changed to any material other than an aluminum metal material as long as it is an electrically-conducting material that has a shielding function. Furthermore, the pipe body 14 and the braided member 15 are not necessarily made of the same type of metal, and may also be made of different types of metal.

Furthermore, in the foregoing embodiment, the coupling member 16 is made of stainless steel, which has a smaller linear expansion coefficient than an aluminum metal material of which the pipe body 14 is made, but the present disclosure is not limited to this, and the coupling member 16 may also be made of a material that has a larger linear expansion coefficient than that of the pipe body 14. In this case, if the temperature in the usage environment increases and the pipe body 14 thermally expands, the diameter of the spring part 21 of the coupling member 16 will be reduced while conforming to the outer diameter of the pipe body 14, and thus fastening around the braided member 15 will not likely to become loose, realizing the same effects as those in the foregoing embodiment. Furthermore, the coupling member 16 does not need to be made of an electrically-conducting material, and the coupling member 16 may also be made of, for example, a synthetic resin.

In the foregoing embodiment, the insulating member 18 is an adhesive tape, but instead, the insulating member 18 may also be a non-adhesive sheet-shaped member, for example.

In the foregoing embodiment, a configuration is also possible in which the insulating member 18 is omitted, and the coupling member 16 is in direct contact with the outer circumferential surface of the braided member 15. In this case, it is desirable to provide a watertight member such as a grommet that covers the outer circumferences of the coupling member 16 and the externally fitted part 15a of the braided member 15, in order to suppress electric corrosion between the coupling member 16 and the braided member 15.

The foregoing embodiment is applied to the conductive path 10 that connects a high-voltage battery and an inverter device in a hybrid car, but may also be applied to a conductive path that is arranged between other devices.

The foregoing embodiment and modifications may also be combined with each other as appropriate.

As shown in FIG. 3, in a cross section orthogonal to an axis Ax of the pipe body 14, the annular overlapping portion in which the pipe body 14 and the externally fitted part 15a of the braided member 15 overlap each other, and the spring part 21 of the coupling member 16 are preferably circular. According to this configuration, due to the resiliently shrinking force of the coupling member 16, the braided member 15 is pressed against the entire outer circumferential surface of the pipe body 14 uniformly or substantially uniformly.

As shown in FIG. 5, in the cross section orthogonal to the axis Ax of the pipe body 14, the spring part 21 of the coupling member 16 preferably has a smoothly curved inner surface. According to this configuration, due to the smoothly curved inner surface of the spring part 21, the braided member 15 is pressed against the entire outer circumferential surface of the pipe body 14 uniformly or substantially uniformly.

The coupling member 16 of the foregoing embodiment functions as a resiliently shrinkable annular fastener.

The present disclosure encompasses the following configurations. The reference numerals are given to constituent components of the embodiments by way of help in understanding it and not for limitative purposes.

APPENDIX 1

A vehicular electromagnetic shielding component (12) including:
an electromagnetic shielding pipe body (14) that is a metal pipe or an alloy pipe with an axis (Ax), an open end, an inner surface that defines a hollow space in which at least one insulated covered electric wire (11) is to be arranged, and an outer surface;
an electromagnetic shielding mesh tubular body (15) with an open end that is connected to the open end of the electromagnetic shielding pipe body (14), the electromagnetic shielding mesh tubular body (15) forming an annular overlapping portion in which the electromagnetic shielding pipe body (14) and the electromagnetic shielding mesh tubular body (15) overlap each other with the open end of the electromagnetic shielding mesh tubular body (15) being in electric contact with the outer surface of the open end of the electromagnetic shielding pipe body (14); and
a resiliently shrinkable annular fastener (16) that is externally mounted on the annular overlapping portion constituted by the electromagnetic shielding pipe body (14) and the electromagnetic shielding mesh tubular body (15), and is configured to press inwardly the entire circumference of the annular overlapping portion toward the axis (Ax) of the electromagnetic shielding pipe body (14).

APPENDIX 2

The vehicular electromagnetic shielding component (12) according to Appendix 1, wherein the resiliently shrinkable annular fastener (16) is resiliently deformable between a natural state in which it has a first inner diameter and an increased-diameter state in which it has a second inner diameter that is larger than the first inner diameter, and the resiliently shrinkable annular fastener (16) is externally mounted on the annular overlapping portion in the increased-diameter state.

APPENDIX 3

The vehicular electromagnetic shielding component (12) according to Appendix 1 or 2, wherein the resiliently shrinkable annular fastener (16) includes a curved plate part (21) that has a predetermined width and is configured to press the entire circumference of the annular overlapping portion inwardly.

APPENDIX 4

The vehicular electromagnetic shielding component (12) according to Appendix 3, wherein the curved plate part (21) of the resiliently shrinkable annular fastener (16) includes a smoothly curved inner surface configured to come into direct contact with the entire circumference of the annular overlapping portion.

APPENDIX 5

The vehicular electromagnetic shielding component (12) according to Appendix 3, further comprising, in the annular overlapping portion, an insulating tape (18) that is directly wound around the outer circumference of the electromagnetic shielding mesh tubular body (15), wherein the curved plate part (21) of the resiliently shrinkable annular fastener (16) is configured to press inwardly the entire circumference of the annular overlapping portion via the insulating tape (18), without being in contact with the annular overlapping portion.

APPENDIX 6

The vehicular electromagnetic shielding component (12) according to Appendix 4 or 5, wherein, in a cross section orthogonal to the axis (Ax), the annular overlapping portion and the curved plate part (21) are circular.

It would be apparent to a person skilled in the art that the present disclosure may be embodied in other specific aspects without departing from the scope of the technical idea of the present disclosure. For example, some of the components described in the foregoing embodiment (or one or more aspects thereof) may also be omitted or may be combined with each other.

The invention claimed is:

1. An electromagnetic shielding component comprising:
a pipe body that is conductive; and
a braid that is tubular and that is obtained by braiding conductive bar wires, the braid and the pipe body being coupled to each other by a coupler in a state in which an end portion of the braid is externally fitted onto an end of the pipe body,
wherein the coupler includes a spring that is annular in a free state, the spring has a diameter that is reduced due to a radially inward elastic force of the spring, an inner diameter of the spring that has the reduced diameter being set to a value smaller than an outer diameter of the pipe body at a lowest conceivable temperature in a usage environment, and the spring is externally arranged on the braid while surrounding an outer circumference of the braid, and is configured to sandwich and hold the braid together with the pipe body only using the radially inward elastic force of the spring, the diameter of the spring being able to be reduced using the radially inward elastic force of the spring in accordance with shrinkage in an outer diameter of the pipe body that is caused due to a reduction in the temperature in the usage environment.

2. The electromagnetic shielding component according to claim 1,
wherein the spring has a shape such that a flat spring is formed into an annular shape, and is provided with, at respective ends thereof, protrusions that protrude to an outer circumferential side.

3. The electromagnetic shielding component according to claim 1,
wherein the braid and the coupler are made of different types of metal, and
an insulator that is tubular is interposed between the braid and the spring of the coupler, the insulator covering the outer circumference of the braid.

4. The electromagnetic shielding component according to claim 3,
wherein the insulator is heat resistant.

5. The electromagnetic shielding component according to claim 2,
wherein the spring is provided with, at a position in the vicinity of one of the protrusions, an engagement configured to engage the other one of the protrusions to keep the spring in an annular and increased-diameter state, and
when the engagement is disengaged from the other one of the protrusions, the diameter of the spring is reduced from that in the annular and increased-diameter state.

6. The electromagnetic shielding component according to claim 5,
  wherein the protrusions and the engagement of the spring are able to be folded down so that protrusion heights, in a radial direction, of the protrusions and the engagement are small.

7. A conductive path comprising:
  the electromagnetic shielding component according to claim 1; and
  an electric wire that is passed through the pipe body and the braid of the electromagnetic shielding component.

\* \* \* \* \*